(12) United States Patent
Tanaka

(10) Patent No.: US 6,989,704 B2
(45) Date of Patent: *Jan. 24, 2006

(54) DELAY CIRCUIT HAVING FUNCTION OF FILTER CIRCUIT

(75) Inventor: Tomoharu Tanaka, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/010,290

(22) Filed: Dec. 14, 2004

(65) Prior Publication Data

US 2005/0093605 A1 May 5, 2005

Related U.S. Application Data

(63) Continuation of application No. 10/656,254, filed on Sep. 8, 2003.

(30) Foreign Application Priority Data

Jul. 4, 2003 (JP) .............................. 2003-192232

(51) Int. Cl.
*H03H 11/26* (2006.01)
(52) U.S. Cl. ...................................... 327/261; 327/262
(58) Field of Classification Search ................ 327/261, 327/262, 263, 264, 266, 268, 276, 278, 280, 327/281, 283
See application file for complete search history.

(56) References Cited

U.S. PATENT DOCUMENTS

| 5,343,086 | A | * | 8/1994 | Fung et al. | .................... 327/63 |
| 5,994,939 | A | * | 11/1999 | Johnson et al. | ............. 327/280 |
| 6,054,884 | A | * | 4/2000 | Lye | ............................ 327/269 |
| 6,323,712 | B1 | | 11/2001 | Shih | ........................... 327/276 |
| 6,348,827 | B1 | * | 2/2002 | Fifield et al. | ............... 327/278 |

FOREIGN PATENT DOCUMENTS

| JP | 8-70242 | 3/1996 |
| JP | 8-190798 | 7/1996 |

* cited by examiner

*Primary Examiner*—Linh My Nguyen
(74) *Attorney, Agent, or Firm*—Oblon, Spivak, McClelland, Maier & Neustadt, P.C.

(57) ABSTRACT

A first PMOS transistor is connected between a supply terminal of a power supply voltage VCC and a connection node MON. A first NMOS transistor and a second NMOS transistor are connected between the connection node MON and ground. The first PMOS transistor and the first NMOS transistor are driven by an input signal. The second NMOS transistor is driven by a constant current IREF. In cooperation with the first NMOS transistor, the second NMOS transistor discharges the charge across a capacitor C1 connected to the connection node MON. A differential amplifier compares a potential at the connection node MON with a potential depending upon the constant current IREF, and outputs a result of the comparison.

16 Claims, 3 Drawing Sheets

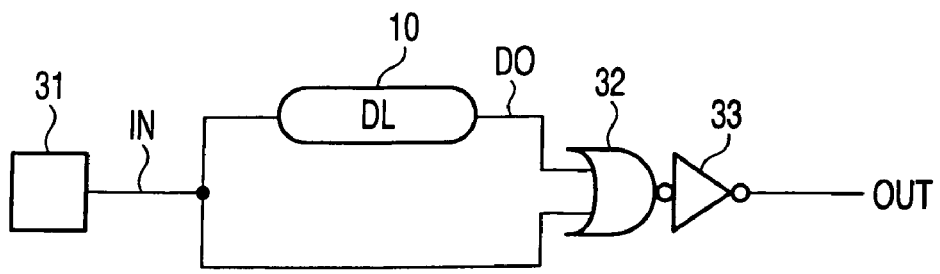
F I G. 4
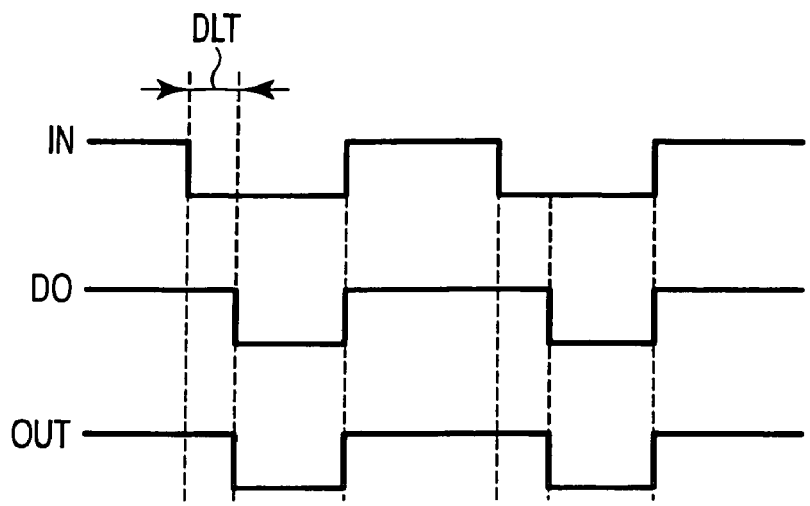
F I G. 5
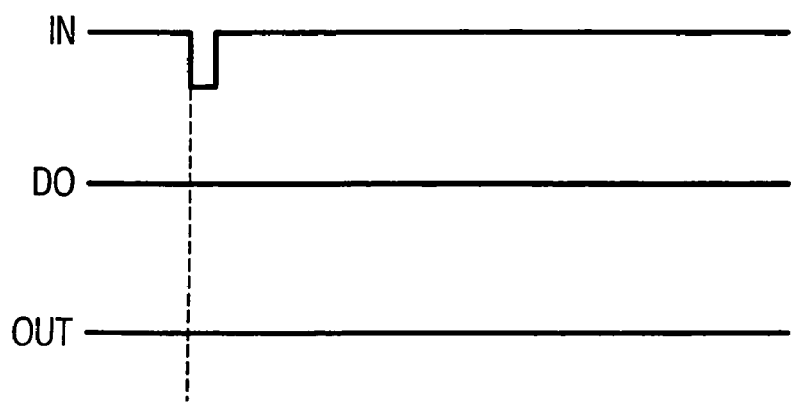
F I G. 6

DELAY CIRCUIT HAVING FUNCTION OF FILTER CIRCUIT

CROSS-REFERENCE TO RELATED APPLICATIONS

This application is based upon and claims the benefit of priority from the prior U.S. application Ser. No. 10/656,254, filed Sep. 8, 2003 and Japanese Patent Application No. 2003-192232, filed Jul. 4, 2003, the entire contents of which are incorporated herein by reference.

BACKGROUND OF THE INVENTION

1. Field of the Invention

The present invention relates to a delay circuit that is applied to, for example, semiconductor devices such as semiconductor memories, and has a function of a filter for removing noise.

2. Description of the Related Art

A plurality of delay circuits having various delay times are used in semiconductor devices. The most typical delay circuit in semiconductor devices is an inverter chain including a plurality of inverter circuits. Supposing that one inverter circuit has a delay time of 1 nsec, an inverter chain including ten inverter circuits can have a delay time of 10 nsec. However, characteristics of the inverter circuit vary according to the power supply voltage, temperature, and processing precision of the transistors included in the inverter circuit. Therefore, the delay time of a delay circuit of the inverter chain type often varies greatly. There is also a delay circuit of a type using an RC time constant obtained by combining a resistor element with a capacitor. In this delay circuit as well, however, the delay time varies according to the processing precision of the resistor element and the capacitor and the temperature.

In recent years, improved delay circuits have been proposed so as to provide a stable delay time by compensating for the processing dispersion of the transistors included in the delay circuit, the change of the power supply voltage, and the temperature change. Such delay circuits are disclosed in Japanese Patent Application KOKAI Publication No. 8-70242, U.S. Pat. No. 5,627,488, and U.S. Pat. No. 5,969,557. In addition, a delay circuit having a delay time that becomes shorter as the power supply voltage rises is disclosed in Japanese Patent Application KOKAI Publication No. 8-190798.

As the power supply voltage in the semiconductor devices becomes lower, it is becoming impossible to achieve a stable delay time in a conventional delay circuit. In other words, delays of a logic circuit, such as an inverter circuit that forms the delay circuit, and an output circuit itself that forms a delay signal are actualized. Even if the delay circuit itself is stable, therefore, the resultant delay time varies greatly according to the power supply voltage. Therefore, it is desired that a delay circuit capable of providing a stable delay time irrespective of the power supply voltage is developed.

BRIEF SUMMARY OF THE INVENTION

According to an aspect of the invention, there is provided a delay circuit comprising: a first switch connected between a first power supply and a first node, the first switch being switched according to an input signal; a second switch having a current path connected at a first end thereof to the first node, the second switch being switched according to the input signal; a third switch connected between a second end of the current path of the second switch and a second power supply, the third switch making a constant current flow according to a control signal formed of a constant current; a capacitor connected between the first node and the second power supply; and a differential amplifier supplied at a first input end thereof with a potential at the first node and supplied at a second input end thereof with a potential depending upon the control signal, the differential amplifier comparing the potential at the first node with the potential depending upon the control signal and outputting an output signal from an output terminal thereof.

According to another aspect of the invention, there is provided a delay circuit comprising: a first switch performing switching between a first power supply and a first node; a second switch performing switching between a second power supply and the first node; a capacitor connected at a first end thereof to the first node; a constant current source having an output terminal for outputting a constant current; a first MOS transistor of second conductivity type having a source, a drain and a gate, the first MOS transistor being included in a circuit of the constant current source, the drain and the gate being connected in common to the output terminal, the source being connected to the second power supply; and a current mirror differential amplifier for comparing a voltage at the first node with a voltage at the output terminal, the current mirror differential amplifier outputting a result of the comparison from a first output terminal.

According to another aspect of the invention, there is provided a delay circuit comprising: a first transistor of first conductivity type connected between a first power supply and a first node, the first transistor being switched according to an input signal; a second transistor of second conductivity type having a current path connected at a first end thereof to the first node, the second transistor being switched according to the input signal; a third transistor of second conductivity type connected between a second end of the current path of the second transistor and a second power supply, the third transistor making a constant current flow according to a control signal formed of a constant current; a capacitor connected between the first node and the second power supply; and a differential amplifier supplied at a first input end thereof with a potential at the first node and supplied at a second input end thereof with a potential depending upon the control signal, the differential amplifier comparing the potential at the first node with the potential depending upon the control signal and outputting an output signal from an output terminal thereof.

BRIEF DESCRIPTION OF THE SEVERAL VIEWS OF THE DRAWING

FIG. 4 is a circuit diagram showing a noise filter circuit to which the present invention is applied;

FIG. 5 is a waveform diagram showing operation of FIG. 4; and

FIG. 6 is a waveform diagram showing different operation of FIG. 4.

DETAILED DESCRIPTION OF THE INVENTION

Hereinafter, an embodiment of the present invention will be described with reference to the drawings.

Figure 1:
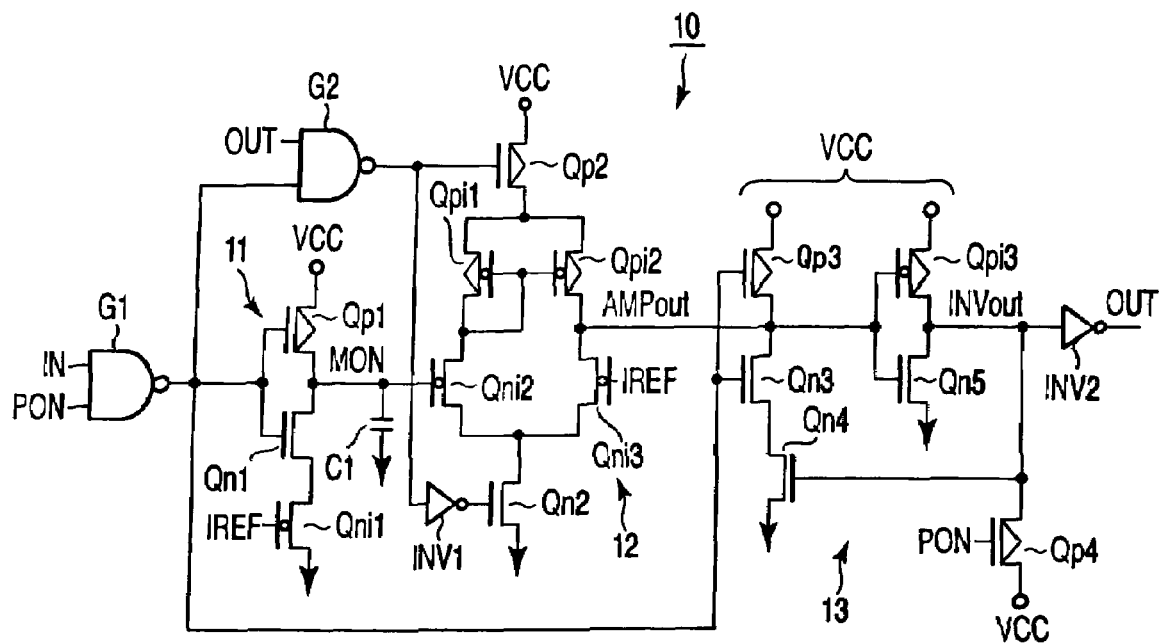
FIG. 1 is a circuit diagram showing a configuration of a delay circuit according to an embodiment of the present invention.
Figure 2:
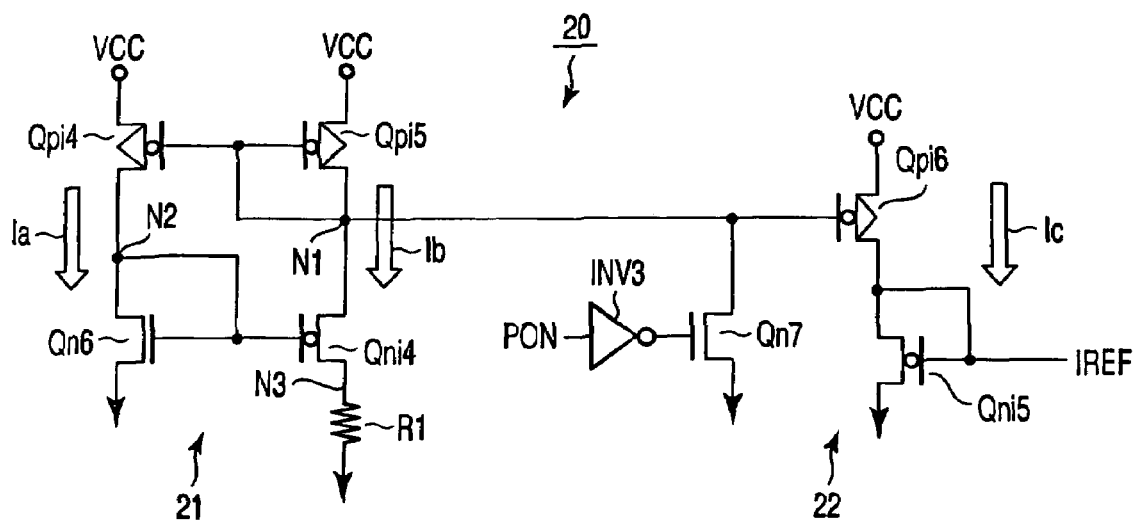
FIG. 2 is a circuit diagram showing a constant current source circuit applied to the circuit shown in FIG. 1.

FIGS. 1 and 2 are diagrams showing an embodiment of the present invention. FIG. 1 shows a delay circuit 10, and FIG. 2 shows a constant current source circuit 20, which supplies a constant current to the delay circuit 10. In FIGS. 1 and 2, a transistor denoted by character Qn is an NMOS transistor, and a transistor denoted by character Qni is also an NMOS transistor. The NMOS transistor Qni has a threshold voltage lower than that of the transistor Qn. A transistor denoted by character Qp is a PMOS transistor, and a transistor denoted by character Qpi is also a PMOS transistor. The PMOS transistor Qpi has a threshold voltage higher than that of the transistor Qp. In other words, each of the NMOS transistor Qni and the PMOS transistor Qpi has a threshold voltage of substantially 0V.

In FIG. 1, an input signal IN and a control signal PON are supplied to input ends of a NAND circuit G1. The control signal PON is a signal generated when, for example, a power supply voltage in the semiconductor device has reached a predetermined level after power is turned on in the semiconductor device. Between a terminal supplied with a power supply voltage VCC and ground, a PMOS transistor Qp1, an NMOS transistor Qn1 and a transistor Qni1 are connected in series. An output end of the NAND circuit G1 is connected to gates of the PMOS transistor Qp1 and the NMOS transistor Qn1. The NMOS transistor Qni1 is supplied at its gate with a signal IREF supplied from the constant current source circuit 20. The NMOS transistor Qni1 makes a constant current according to the signal IREF flow. A capacitor C1 is connected between a connection node MON of the PMOS transistor Qp1 and the NMOS transistor Qn1 and the ground.

If both the input signal IN and the control signal PON are at high levels, then an output signal of the NAND circuit G1 becomes a low level, and the PMOS transistor Qp1 turns on. Therefore, the capacitor C1 connected to the connection node MON is charged by the power supply voltage VCC. If the input signal IN or the control signal PON of the NAND circuit G1 is at a low level, then the output signal of the NAND circuit G1 becomes a high level, and consequently the NMOS transistor Qn1 turns on. If the NMOS transistor Qni1 is turned on by a signal IREF, then charge charged in the capacitor C1 is discharged, and a constant current flows from the connection node MON to the ground.

On the other hand, a current mirror differential amplifier 12 includes NMOS transistors Qni2 and Qni3 and PMOS transistors Qpi1 and Qpi2. A PMOS transistor Qp2, an NMOS transistor Qn2, a NAND circuit G2, and an inverter circuit INV1 control operation/nonoperation of the differential amplifier 12. The PMOS transistor Qp2 is connected between the supply terminal of the power supply voltage VCC and first ends of the PMOS transistors Qpi1 and Qpi2. The PMOS transistor Qp2 is supplied at its gate with an output signal of the NAND circuit G2. One input end of the NAND circuit G2 is supplied with the output signal of the NAND circuit G1. The other input end of the NAND circuit G2 is supplied with a signal OUT described later. Second ends of the PMOS transistors Qpi1 and Qpi2 are connected to first ends of the NMOS transistors Qni2 and Qni3, respectively. Gates of the PMOS transistors Qpi1 and Qpi2 are connected to each other, and connected to a connection node between the PMOS transistor Qpi1 and the NMOS transistor Qni2. The NMOS transistor Qni2 is connected at its gate to the connection node MON. The NMOS transistor Qni3 is supplied at its gate with the signal IREF. The NMOS transistor Qn2 is connected between second ends of the NMOS transistors Qni2 and Qni3 and the ground. The output signal of the NAND circuit G2 is supplied to a gate of the NMOS transistor Qn2 via the inverter circuit INV1.

When the input signal IN or PON is at a low level and the signal OUT is at a high level, the differential amplifier 12 comes in an operation state. In other words, at this time, an output signal of the NAND circuit G2 becomes low level to turn on the PMOS transistor Qp2 and the NMOS transistor Qn2. In this state, the differential amplifier 12 detects a potential difference between a potential at the connection node MON and a potential depending upon the signal IREF, and outputs a result of the detection to a connection node AMPout between the PMOS transistor Qpi2 and the NMOS transistor Qni3.

A latch circuit 13 is connected to the connection node AMPout. The latch circuit 13 includes PMOS transistors Qp3, Qpi3 and Qp4, and NMOS transistors Qn3, Qn4 and Qn5. The PMOS transistor Qp3 and the NMOS transistors Qn3 and Qn4 are connected in series between a supply terminal of the power supply voltage VCC and the ground. Gates of the PMOS transistor Qp3 and the NMOS transistor Qn3 are connected to the output end of the NAND circuit G1. A connection node between the PMOS transistor Qp3 and the NMOS transistor Qn3 is connected to the connection node AMPout, and connected to gates of the PMOS transistor Qpi3 and the NMOS transistor Qn5. The PMOS transistor Qpi3 and the NMOS transistor Qn5 are connected in series between a supply terminal of the power supply voltage VCC and the ground. A connection node INVout between the transistors Qpi3 and Qn5 is connected to the NMOS transistor Qn4 at its gate, and in addition, connected to a power supply terminal of the power supply voltage VCC via the PMOS transistor Qp4. The PMOS transistor Qp4 is supplied at its gate with the control signal PON. In addition, the connection node INVout is connected to an input end of an inverter circuit INV2. The signal OUT is output from an output end of the inverter circuit INV2.

In the latch circuit 13, when both the input signal IN and the control signal PON are at the high level, the output signal of the NAND circuit G1 becomes a low level and the PMOS transistor Qp3 turns on. Therefore, the connection node AMPout becomes a high level, and the connection node INVout becomes a low level. As a result, the output signal OUT of the inverter INV2 becomes a high level. At this time, the NMOS transistor Qn4 is in the off-state.

On the other hand, if the input signal IN or the control signal PON is at a low level, then the output signal of the NAND circuit G1 becomes high level, and consequently the NMOS transistor Qn3 turns on. Supposing that the connection node INVout is at a high level, the NMOS transistor Qn4 is also in the on-state, and consequently the connection node AMPout is pulled down to a low level by the transistors Qn3 and Qn4. As a result, the connection node AMPout is latched in the low level state and the connection node INVout is latched in the high level state. This latch state can be formed easily, because the PMOS transistor Qp4 turns on when the control signal PON is at a low level. In other words, the control signal PON is at a low level before power is turned on. As a result, the transistor Qp4 is in the on-state, and the connection node INVout is reset to the high level and the output signal OUT is reset to the low level. If in this state the control signal PON becomes a high level after the power is turned on, then the PMOS transistor Qp4 turns off, and the output signal OUT of the delay circuit 10 changes according to the input signal IN.

A constant current source circuit 20 shown in FIG. 2 includes two current mirror circuits 21 and 22. The current mirror circuit 21 includes PMOS transistors Qpi4 and Qpi5, NMOS transistors Qn6 and Qpi4, and a resistor R1. In other words, the PMOS transistor Qpi4 and the NMOS transistor Qn6 are connected in series between a supply terminal of the power supply voltage VCC and the ground. The PMOS transistor Qpi5, the NMOS transistor Qni4, and the resistor R1 are connected in series between a supply terminal of the power supply voltage VCC and the ground. Gates of the PMOS transistors Qpi4 and Qpi5 are connected to each other, and connected to a connection node N1 between the PMOS transistor Qpi5 and the NMOS transistor Qni4, and further connected to a PMOS transistor Qpi6 at its gate. Gates of the NMOS transistors Qn6 and Qni4 are connected to each other, and connected to a connection node N2 between the PMOS transistor Qpi4 and the NMOS transistor Qn6.

A PMOS transistor Qpi6 and an NMOS transistor Qni5 included in the current mirror circuit 22 are connected in series between a supply terminal of the power supply voltage VCC and the ground. The PMOS transistor Qpi6 is connected at its gate to the ground via an NMOS transistor Qn7. The NMOS transistor Qn7 is supplied at its gate with the control signal PON via an inverter circuit INV3. A connection node between the PMOS transistor Qpi6 and the NMOS transistor Qni5 is connected to the NMOS transistor Qni5 at its gate. The gate of the NMOS transistor Qni5 is connected to the gates of the transistors Qni1 and Qni3 shown in FIG. 1. The signal IREF serving as the constant output current is output from the gate of the NMOS transistor Qni5.

In the above-described configuration, a current Ib, which flows through the PMOS transistor Qpi5 included in the current mirror circuit 21, is mirrored in a current Ia, which flows through the PMOS transistor Qpi4. Therefore, the current Ia is equal to the current Ib (Ia=Ib). In addition, the current Ia, which flows through the NMOS transistor Qn6, is mirrored in the current Ib, which flows through the NMOS transistor Qni4. Therefore, a voltage at a connection node N3 between the NMOS transistor Qni4 and the resistor R1 becomes a value obtained by subtracting a threshold voltage of the NMOS transistor Qni4 from a threshold voltage of the NMOS transistor Qn6. Typically, this value does not depend on the temperature and the power supply voltage. In addition, since variation of the threshold voltage at the NMOS transistor Qn6 is linked to the threshold voltage at the NMOS transistor Qni4, high stability is achieved. For example, supposing that the potential at the connection node N3 is 0.4V and resistance of the resistor R1 is 400 kΩ, it follows that Ia=Ib=1 μA. In addition, the PMOS transistor Qpi5 and the PMOS transistor Qpi6 are mirror-connected. Therefore, a current Ic, which flows through the PMOS transistor Qpi6, becomes equal to the current Ib (Ib=Ic). The current Ic, which flows through the NMOS transistor Qni5, is a constant current. Therefore, the NMOS transistors Qni1 and Qni3 shown in FIG. 1 and mirror-connected with the NMOS transistors Qni5 also make the constant current Ic flow. In the NMOS transistor Qni5, a potential depending upon the signal IREF is determined so as to make the current that flows through the NMOS transistor Qni5 equal to Ic.

The constant current source circuit 20 shown in FIG. 2 is started by the control signal PON. In other words, when the control signal PON is at a low level, the NMOS transistor Qn7 turns on, and the gates of the PMOS transistors Qpi5 and Qpi6 are pulled down to the ground potential. Thereafter, if the control signal PON becomes a high level, then the NMOS transistor Qn7 turns off, and the signal IREF converges to a stable point by the above-described operation.

Figure 3:
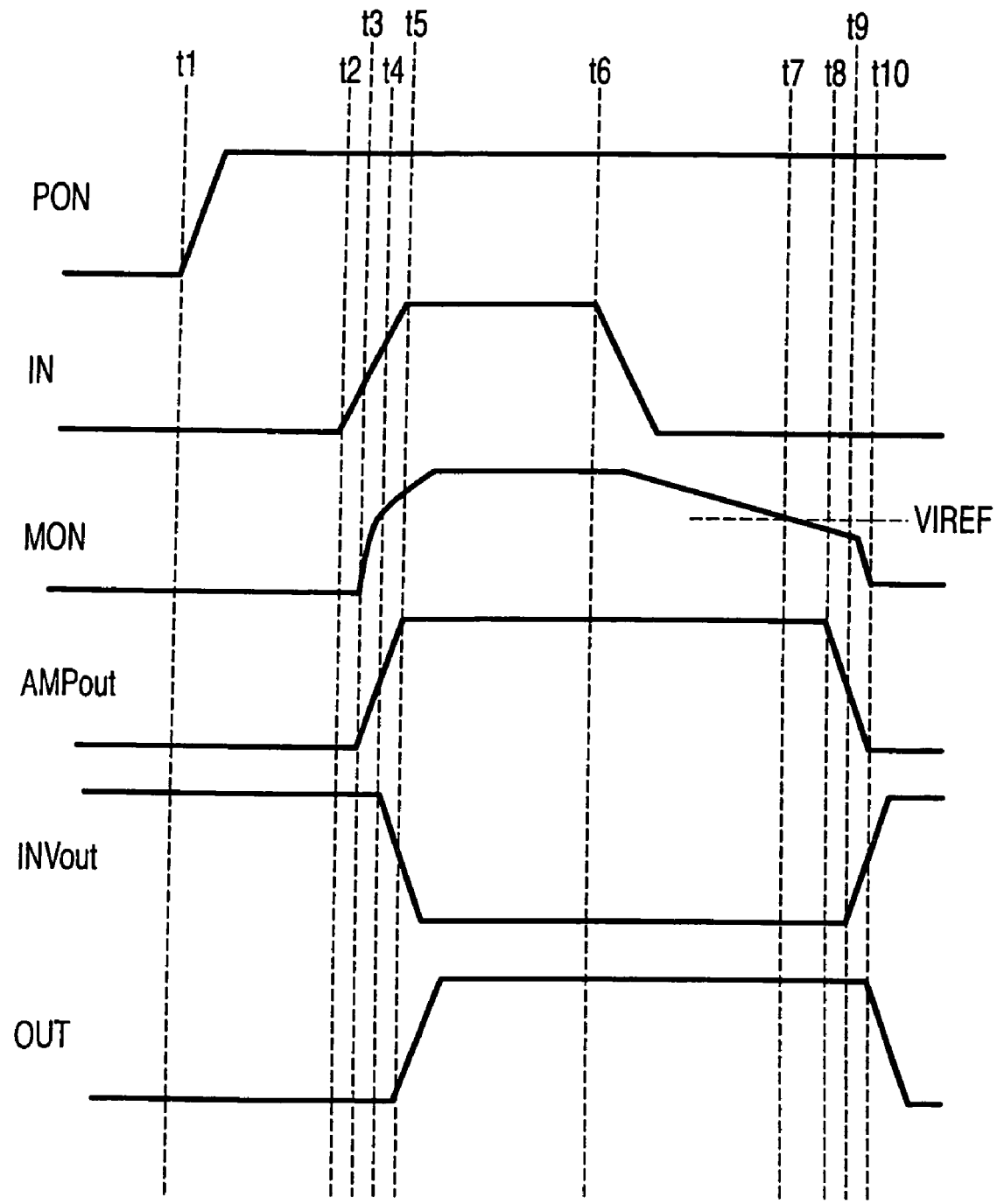
FIG. 3 is a waveform diagram showing operation timing of the delay circuit shown in FIG. 1.

FIG. 3 shows operation of the delay circuit 10 shown in FIG. 1. The operation of the delay circuit 10 will now be described with reference to FIG. 3.

First, until time t1, the signal PON is at a low level and the delay circuit 10 shown in FIG. 1 and the constant current source circuit 20 shown in FIG. 2 are held at the reset state. At this time, the connection node MON, the connection node AMPout, and the output signal OUT are at the ground level (0V), and the connection node INVout assumes the power supply voltage VCC.

If the input signal IN rises at time t2, then the PMOS transistors Qp1 and Qp3 turn on. At time t3, which is slightly later instant from t2, the potential at the connection node MON and the connection node AMPout begins to rise and ascends toward the power supply voltage VCC. If the connection node AMPout becomes high level, then the potential at the connection node INVout begins to fall and descends toward 0V at time t4. In addition, if the connection node INVout becomes low level, then the potential of the output signal OUT ascends toward the power supply voltage VCC at time t5. While the input signal IN is at a high level, the differential amplifier 12 is in the non-operate state.

If the input signal IN becomes a low level at time t6, then the output signal of the NAND circuit G1 becomes a high level, and the NMOS transistor Qni1 turns on. As a result, charge stored at the connection node MON by the capacitor C1 is discharged via the NMOS transistors Qn1 and Qni1. A current that flows through the NMOS transistor Qni1 is constant. As shown in FIG. 3, therefore, the potential at the connection node MON falls in a straight line form. If the input signal IN becomes the low level and consequently the output signal of the NAND circuit G1 becomes high level, then the output signal of the NAND circuit G2 becomes the low level. As a result, the differential amplifier 12 is activated and a potential difference between the potential at the connection node MON and the potential VIREF depending upon the signal IREF is detected. If the potential at the connection node MON becomes lower than the potential VIREF prescribed by the constant current IREF (after time t7), the potential at the connection node AMPout begins to fall at t8, which is slightly later instant from t7. If the potential at the connection node AMPout becomes low level, the potential at the connection node INVout begins to rise at time t9. In addition, if the potential at the connection node INVout becomes high level, then the output signal OUT begins to fall at time t10.

In this way, according to the delay circuit 10 shown in FIG. 1, it is possible to achieve a delay time substantially equivalent to (t10–t6) between the instant when the input signal IN becomes the low level and the instant when the output signal OUT becomes the low level.

Time (t7–t6) is determined substantially by a time required for the connection node MON to change from the power supply voltage VCC to the potential VIREF determined depending upon the constant current IREF. The relation can be represented as:

$$t7-t6 = C1 \times (VCC - VIREF)/Ic$$

From this equation, it will be appreciated that the time (t7–t6) becomes shorter as the power supply voltage VCC becomes lower. The velocity at which the connection node AMPout proceeds from the time t8 toward 0V is substantially constant, because the NMOS transistor Qni3 makes the constant current Ic flow. The time between the instant when the connection node AMPout begins to proceed to 0V and the instant when the output becomes low level is prescribed by delays caused by two interposed inverter circuits. The delay of each of the inverter circuits becomes longer, as the power supply voltage becomes lower. Therefore, the delay circuit 10 can cancel the fact that the time (t7–t6) becomes shorter and the delay time of the inverter circuit becomes longer as the power supply voltage VCC becomes lower. As a result, stable delay time can be achieved.

For example, supposing the environmental temperature to be ordinary temperature, the power supply voltage VCC to be 1.8V, and VIREF to be 0.3V, it is supposed that the time (t7–t6)=7.5 nsec, the time (t8–t7)=3 nsec and the time (t10–t8)=3 nsec. In this case, the delay time (t10–t6) is equal to 13.5 nsec. If the environmental temperature becomes lower than the ordinary temperature and the power supply voltage VCC becomes 2.0V, then VIREF becomes 0.25V, the time (t7–t6) becomes 8.75 nsec, whereas the time (t8–t7) remains unchanged, and the time (t10–t8) becomes 1.5 nsec because the delay times of the inverter circuits become shorter. Therefore, the delay time becomes 13.25 nsec. On the other hand, if the environmental temperature becomes higher than the ordinary temperature and the power supply voltage VCC becomes 1.6V, then VIREF becomes 0.35V, the time (t7–t6) becomes 6.25 nsec, whereas the time (t8–t7) remains unchanged, and the time (t10–t8) becomes 6 nsec because the delay times of the inverter circuits become longer. Therefore, the delay time becomes 15.25 nsec. In addition, supposing that the threshold voltage of the NMOS transistor varies by ±50 mV, the VIREF also varies by ±50 mV. Accordingly, the time (t7–t6) changes by ±0.25 nsec. Therefore, the delay time is 13 nsec minimum and 15.5 nsec maximum.

It is now supposed that the gate of the NMOS transistor Qni3 is supplied with a fixed potential instead of the signal IREF. When the threshold voltage at the transistor Qni3 has risen, the current that the NMOS transistor Qni3 can make flow decreases and the time between t7 and t8 becomes long. As a result, the delay time becomes unstable.

For example, it is now supposed that the VIREF has a fixed potential of 0.3V. Supposing the environmental temperature to be ordinary temperature, the power supply voltage VCC to be 1.8V, it is supposed that the time (t7–t6)=7.5 nsec, the time (t8–t7)=3 nsec and the time (t10–t8)=3 nsec. In this case, the delay time (t10–t6) is equal to 13.5 nsec. If the environmental temperature becomes lower than the ordinary temperature and the power supply voltage VCC becomes 2.0V, then the time (t7–t6) becomes 8.5 nsec, and the time (t8–t7) becomes 1.5 nsec. The time (t10–t8) becomes 1.5 nsec because the delay times of the inverter circuits become shorter. Therefore, the delay time becomes 11.5 nsec. On the other hand, if the environmental temperature becomes higher than the ordinary temperature, the power supply voltage VCC becomes lower and becomes 1.6V, then the time (t7–t6) becomes 6.5 nsec. The time (t8–t7) becomes longer and becomes 6 nsec. The time (t10–t8) becomes 6 nsec because the delay times of the inverter circuits become longer. Therefore, the delay time becomes 18.5 nsec. In addition, supposing that the threshold voltage of the NMOS transistor varies by ±50 mV, the variation of the delay time becomes further greater.

If the PMOS transistor Qpi3 included in the differential amplifier 12 is controlled by a stationary voltage, therefore, the delay time varies from 11.5 nsec to 18.5 nsec. On the other hand, if the PMOS transistor Qpi3 is controlled by a constant current as shown in FIG. 1, then the variation of the delay time can be confined to a comparatively narrow range between 13.0 nsec and 15.5 nsec.

According to the embodiment, the NMOS transistor Qni1 connected to the inverter circuit 11, which operates according to the input signal IN, is driven by the constant current IREF supplied from the constant current source circuit 20, and the NMOS transistor Qni1 discharges the charge charged across the capacitor C1, with a constant current. Therefore, the potential at the connection node MON in the inverter circuit 11 falls at a constant speed. The differential amplifier 12 compares the potential at the connection node MON with the potential VIREF depending upon the constant current IREF supplied from the constant current source circuit 20, and outputs a result of the comparison from the connection node AMPout. In this way, the discharge time of the capacitor C1 and the potential VIREF serving as the reference potential of the differential amplifier 12 are controlled by the constant current IREF supplied from the constant current source circuit 20. As compared with a delay circuit using a CR time constant circuit and a delay circuit of inverter chain type, therefore, the influence of the variation of the power supply voltage on the variation of the delay time can be reduced.

In addition, the variation of the delay time of the signal output from the differential amplifier 12, depending upon the variation of the power supply voltage, is opposite in characteristics to the variation of the delay time of the inverter circuit connected to the connection node AMPout, depending upon the variation of the power supply voltage. This results in an advantage that the variation of the delay time of the whole delay circuit 10 can be reduced.

FIG. 4 shows an example of a noise filter circuit using the delay circuit 10 shown in FIG. 1. For example, the input end of the delay circuit 10 is connected to an input pad 31 of a semiconductor device. The constant current source circuit 20 is omitted in FIG. 4. The output end of the delay circuit 10 and the input pad 31 are connected to input ends of a logic circuit, such as a NOR circuit 32. An output end of the NOR circuit 32 is connected to an inverter circuit 33.

If in the configuration the input signal IN having a pulse width wider than a delay time DLT preset in the delay circuit 10 as shown in FIG. 5 is supplied to the input pad 31, then a signal DO is output from the delay circuit 10. The falling edge of the signal DO is delayed from the falling edge of the input signal IN according to the delay time DLT. An output signal OUT of the inverter circuit 33 becomes a signal similar to the output signal DO according to the output signal DO of the delay circuit DL and the input signal IN.

On the other hand, if noise having a width narrower than the delay time DLT is supplied to the input pad 31 as the input signal IN as shown in FIG. 6, then the output signal DO of the delay circuit 10 does not change. Therefore, both the output signal DO of the delay circuit 10 and the output signal OUT of the inverter circuit 33 remain high level. Thus, the input signal supplied as noise can be removed.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A delay circuit comprising:
   a first switch connected between a first power supply and a first node;
   a second switch having a current path connected at a first end thereof to the first node;
   a third switch connected between a second end of the current path of the second switch and a second power supply, the third switch being controlled by a control signal with a constant current;
   a capacitor connected between the first node and the second power supply; and
   a differential amplifier supplied at a first input end thereof with a potential at the first node and supplied at a second input end thereof with a potential depending upon the control signal.

2. The circuit according to claim 1, the differential amplifier comprising:
   a fourth switch having a current path connected at a first end thereof to the first power supply;
   a fifth switch having a current path connected at a first end thereof to a second end of the fourth switch and connected at a second end thereof to the second power supply, the fifth switch being connected at a gate thereof to the first input end;
   a sixth switch having a current path connected at a first end thereof to the first power supply, the sixth switch being connected at a gate thereof to a gate of the fourth switch and a second end of the current path of the fourth switch; and
   a seventh switch having a current path connected at a first end thereof to a second end of the sixth switch and connected at a second end thereof to the second power supply, the seventh switch being connected at a gate thereof to the second input end.

3. The circuit according to claim 1, further comprising a constant current source circuit for generating the control signal formed of the constant current.

4. The circuit according to claim 3, the constant current source circuit comprising:
   a first current mirror circuit;
   a fourth switch having a current path connected at a first end thereof to the first power supply, the fourth switch being connected at a gate thereof to an output node of the first current mirror circuit; and
   a fifth switch having a current path connected at a first end thereof to a second end of the fourth switch, the fifth switch being connected at a second end of the current path to the second power supply, the fifth switch being connected at a gate thereof to the second end of the fourth switch, a gate of the third switch, and the second input end of the differential amplifier,
   wherein the fourth switch and the fifth switch form a second current mirror circuit, the second current mirror circuit making a current equivalent to an output current of the first current mirror circuit flow.

5. The circuit according to claim 4, wherein fourth switch comprises a MOS transistor of first conductivity type, fifth switch comprises a MOS transistor of second conductivity type, and each of the fourth and fifth MOS transistors being set equal to substantially 0V in threshold voltage.

6. The circuit according to claim 2, further comprising a latch circuit for holding an output signal of the differential amplifier.

7. The circuit according to claim 6, further comprising a first logic circuit having first and second input terminals and a first output terminal, an input signal and a control signal generated in response to a power supply voltage being supplied to the first and second input terminals, respectively, and the first output terminal being connected to gates of the first and second switches.

8. The circuit according to claim 7, further comprising:
   a second logic circuit having third and fourth input terminals and a second output terminal, the third and fourth input terminals being supplied with an output signal of the first logic circuit and an output signal of the latch circuit;
   a eighth switch having a current path connected at a first end thereof to the first power supply and connected at a second end thereof to first ends of the fourth and sixth switches, a gate of the eighth switch being supplied with an output signal of the second logic circuit; and
   a ninth switch having a current path connected at a first end thereof to second ends of the fifth and seventh switches and connected at a second end thereof to the second power supply, a gate of the ninth switch being supplied with an inverted output signal of the second logic circuit.

9. The circuit according to claim 8, the latch circuit comprising:
   tenth, eleventh and twelfth switches connected in series between the first power supply and the second power supply, a connection node between the tenth and the eleventh switches being connected to an output node of the differential amplifier, the tenth and the eleventh switches being controlled by an output signal of the first logic circuit;
   thirteenth and fourteenth switches connected in series between the first power supply and the second power supply, the thirteenth and fourteenth switches being controlled by the output signal of the differential amplifier, a potential at a connection node between the thirteenth and fourteenth switches controlling the twelfth switch; and
   a fifteenth switch connected between the connection node between the thirteenth and fourteenth switches and the first power supply, the fifteenth switch setting the connection node between the thirteenth and fourteenth switches equal to a constant potential when the power supplies are turned on.

10. The circuit according to claim 9, wherein each of the first, fourth, sixth, eighth, tenth, thirteenth and fifteenth switches comprises a MOS transistor of first conductivity type, each of the second, third, fifth, seventh, ninth, eleventh, twelfth and fourteenth switches comprises a MOS transistor of second conductivity type, and each of the third, fourth, fifth, sixth, seventh and thirteenth MOS transistors being set equal to substantially 0V in threshold voltage.

11. A delay circuit comprising:
   a first transistor of first conductivity type connected between a first power supply and a first node;
   a second transistor of second conductivity type having a current path connected at a first end thereof to the first node;
   a third transistor of second conductivity type connected between a second end of the current path of the second transistor and a second power supply, the third transistor being controlled by a control signal with a constant current;
   a capacitor connected between the first node and the second power supply; and
   a differential amplifier supplied at a first input end thereof with a potential at the first node and supplied at a second input end thereof with a potential depending upon the control signal, the differential amplifier comparing the potential at the first node with the potential depending upon the control signal and outputting an output signal from an output terminal thereof.

12. The circuit according to claim 11, the differential amplifier comprising:
   a fourth transistor of first conductivity type having a current path connected at a first end thereof to the first power supply;
   a fifth transistor of second conductivity type having a current path connected at a first end thereof to a second end of the fourth transistor and connected at a second end thereof to the second power supply, the fifth transistor being connected at a gate thereof to the first input end;
   a sixth transistor of first conductivity type having a current path connected at a first end thereof to the first power supply, the sixth transistor being connected at a gate thereof to a gate of the fourth transistor and a second end of the current path of the fourth transistor; and
   a seventh transistor of second conductivity type having a current path connected at a first end thereof to a second end of the sixth transistor and connected at a second end thereof to the second power supply, the seventh transistor being connected at a gate thereof to the second input end.

13. The circuit according to claim 11, further comprising a constant current source circuit for generating the control signal formed of the constant current.

14. The circuit according to claim 13, the constant current source circuit comprising:
   a first current mirror circuit;
   a fourth transistor of first conductivity type having a current path connected at a first end thereof to the first power supply, the fourth transistor being connected at a gate thereof to an output node of the first current mirror circuit; and
   a fifth transistor of second conductivity type having a current path connected at a first end thereof to a second end of the fourth transistor, the fifth transistor being connected at a second end of the current path to the second power supply, the fifth transistor being connected at a gate thereof to the second end of the fourth transistor, a gate of the third transistor, and the second input end of the differential amplifier,
   the fourth transistor and the fifth transistor forming a second current mirror circuit, the second mirror circuit making a current equivalent to an output current of the first current mirror circuit flow.

15. A noise filter circuit comprising the delay circuit recited in claim 11.

16. The circuit according to claim 15, further comprising:
   an input pad connected to an input end of the delay circuit; and
   a logic circuit having a first input end connected to an output end of the delay circuit and a second input end connected to the input pad.

* * * * *